(12) United States Patent  
White et al.

(10) Patent No.: US 7,847,866 B2  
(45) Date of Patent: Dec. 7, 2010

(54) METHOD AND APPARATUS FOR ISOLATING IIC BUS NOISE FROM A TUNER IN A TELEVISION RECEIVER

(75) Inventors: David Glen White, Indianapolis, IN (US); Matthew Thomas Mayer, Indianapolis, IN (US)

(73) Assignee: Thomson Licensing, Boulogne Billancourt (FR)

( * ) Notice: Subject to any disclaimer, the term of this patent is extended or adjusted under 35 U.S.C. 154(b) by 22 days.

(21) Appl. No.: 11/893,256

(22) Filed: Aug. 15, 2007

(65) Prior Publication Data

US 2007/0291183 A1      Dec. 20, 2007

Related U.S. Application Data

(62) Division of application No. 11/525,376, filed on Sep. 22, 2006, now Pat. No. 7,268,831, which is a division of application No. 10/030,796, filed on Jan. 11, 2002, now Pat. No. 7,164,449.

(51) Int. Cl.  
*H04N 5/50* (2006.01)

(52) U.S. Cl. .................. 348/731; 348/607; 348/725

(58) Field of Classification Search ............. 348/607, 348/731–733, 725, 533, 729, 609; 345/296, 345/332; 710/14, 27, 52, 74, 110; *H04N 5/50*  
See application file for complete search history.

(56) References Cited

U.S. PATENT DOCUMENTS

| | | | |
|---|---|---|---|
| 4,689,740 A | 8/1987 | Moelands et al. | |
| 5,142,671 A | 8/1992 | Ishida et al. | |
| 5,870,439 A | 2/1999 | Ben-Efraim et al. | |
| 6,075,829 A | 6/2000 | Hayashi et al. | |
| 6,177,964 B1 * | 1/2001 | Birleson et al. | 348/725 |
| 6,351,489 B1 * | 2/2002 | Tetzlaff | 375/238 |
| 6,674,809 B1 * | 1/2004 | Kay | 375/285 |
| 6,678,012 B1 | 1/2004 | Belotserkovsky | |

(Continued)

FOREIGN PATENT DOCUMENTS

EP       0195163       9/1986

(Continued)

OTHER PUBLICATIONS

Patent abstracts of Japan, vol. 009, No. 314, Dec. 10, 1985 & JP 60-144857, Jul. 31, 1985.

(Continued)

*Primary Examiner*—Trang U Tran  
(74) *Attorney, Agent, or Firm*—Robert D. Shedd; Joseph J. Opalach; Reitseng Lin

(57) ABSTRACT

A method and apparatus for isolating a noise intolerant device, e.g., a phase-lock loop of a tuner within a television receiver, from source of noise. In one embodiment, the apparatus isolates a phase-lock loop integrated circuit (IC) from the bus, by providing an isolation buffer that allows the receiver to only pass data to the tuner's phase-lock loop IC when a tune command is issued by a processor. When not being tuned, the IIC lines to the tuner are held HIGH by a buffer until needed again to perform the tuning function. This allows the demodulation circuitry to use a setting for a carrier tracking-loop that optimizes bit error rate performance.

13 Claims, 3 Drawing Sheets

U.S. PATENT DOCUMENTS

| | | |
|---|---|---|
| 6,693,678 B1 | 2/2004 | Tults et al. |
| 6,870,578 B2 * | 3/2005 | Testin .................. 348/725 |
| 7,164,449 B1 | 1/2007 | White et al. |

FOREIGN PATENT DOCUMENTS

| | | |
|---|---|---|
| EP | 0675448 | 10/1995 |
| GB | 2316519 | 2/1998 |
| JP | 5972243 | 4/1984 |
| JP | 60-144857 | 7/1985 |
| JP | 60233965 | 11/1985 |
| JP | 4160487 | 6/1992 |
| JP | 884154 | 3/1996 |
| JP | 9214373 | 8/1997 |
| JP | 10051506 A1 | 2/1998 |
| JP | 1066125 | 3/1998 |
| WO | WO 99/31598 | 6/1999 |

OTHER PUBLICATIONS

Search Report Dated Apr. 13, 2000.

\* cited by examiner

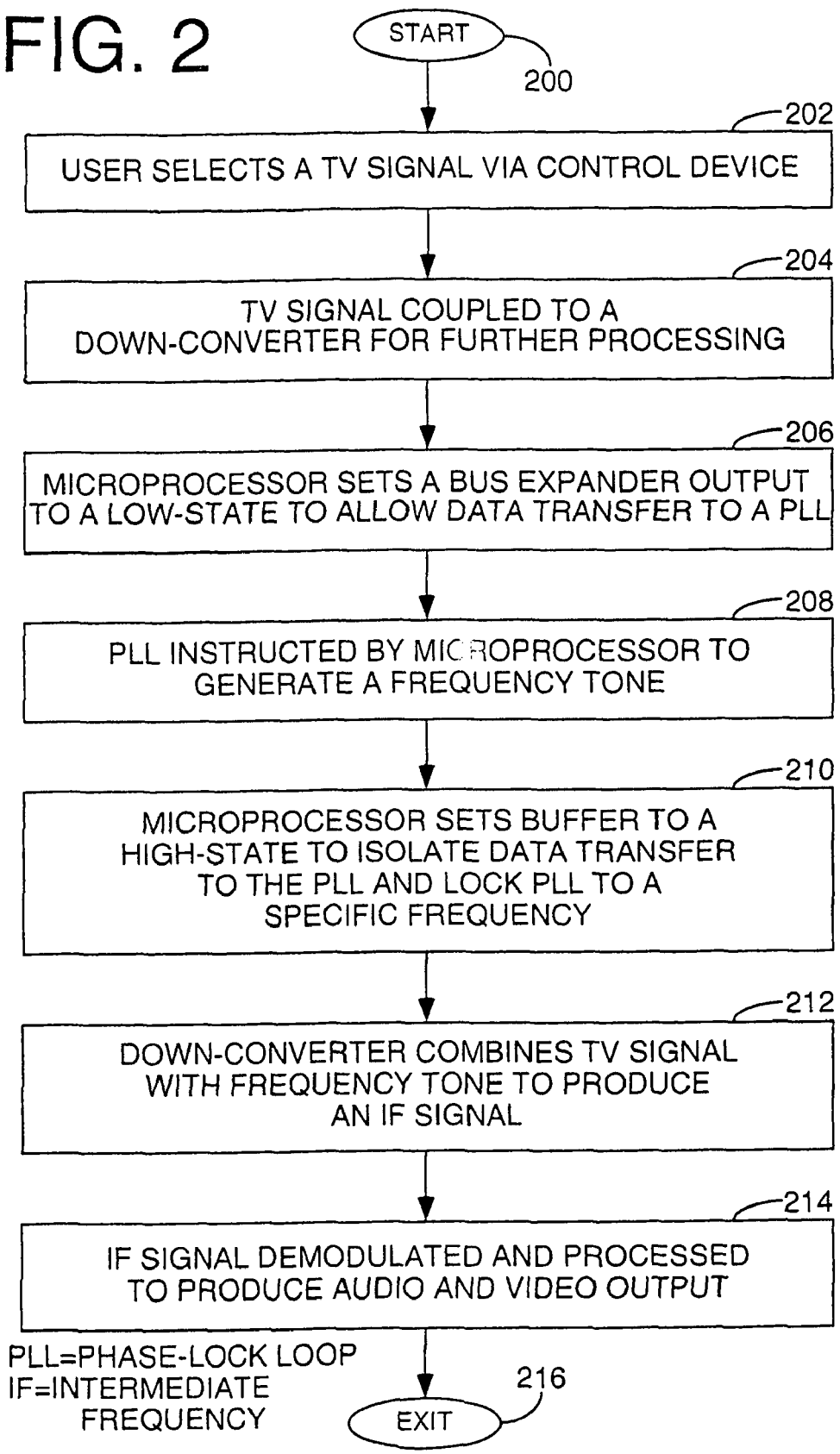

METHOD AND APPARATUS FOR ISOLATING IIC BUS NOISE FROM A TUNER IN A TELEVISION RECEIVER

This application is a divisional application of the U.S. patent application Ser. No. 11/525,376 filed Sep. 22, 2006 now U.S. Pat. No. 7,268,831, which is a divisional application of the U.S. patent application Ser. No. 10/030,796 filed Jan. 11, 2002 now U.S. Pat. No. 7,164,449, herein incorporated by reference.

BACKGROUND OF THE INVENTION

1. Field of Invention

The present invention relates to a television receiver. More particularly, the invention relates to a method of reducing phase noise interference in a phase lock loop circuit of a television receiver.

2. Description of the Background Art

A typical high definition television (HDTV) system employs a front end comprising a tuner, a digital IF circuit and a digital demodulation integrated circuit (IC). The system is controlled from the digital decoder board using an inter-integrated circuit bus ($I^2C$). The terminology IIC bus, I2C bus or $I^2C$ bus are equivalent, as used herein.

The IIC bus is a two wire, bi-directional bus that permits only two integrated circuits (IC's) to communicate on a bus path at a time. An IC serving in a "master" mode of operation, initiates a data transfer on the bus and generates clock signals that permit the data transfer. An IC serving in a "slave" mode of operation is the IC being operated on or communicated to by the master IC, whereby the slave IC is instructed to either send or receive data. Each IC has its own unique seven bit address, wherein the master IC initiates the communications, and also terminates the communications.

A serial clock line (SCL) propagates clock signals on the IIC bus from a master IC to a slave IC. Each master IC generates its own clock signals when transferring data on the bus. The second bi-directional wire of the IIC bus is a serial data line (SDA) that transfers data using eight bit serial transactions. Typically, a ninth bit is utilized as an acknowledgment bit. When both clock and data lines are held "HIGH", no data can be transferred between two IC's. A HIGH to LOW transition on the SDA line, while the SCL line is HIGH, indicates a start condition for the exchange of data bits. Conversely, a LOW to HIGH transition on the SDA line, while the SCL line is HIGH, defines a stop condition. The master IC generates one clock pulse for each data bit transferred on the SDA line, and the HIGH or LOW state of the data line can only change when the clock signal on the SCL line is in a LOW state.

Multiple IC's share the IIC bus. For example, a microprocessor, in a controller of a television receiver, communicates with numerous IC's within the television receiver via an IIC bus. A problem has been uncovered when down-converting a television signal to a specific intermediate frequency (IF) signal. Coincidental bus traffic by the microprocessor, which functions as a master IC, has been found to cause phase noise interference in a tuner of the receiver. Specifically, a phase-lock loop (PLL) integrated circuit is serially coupled on the IIC bus in the tuner of the television receiver, and acts as a frequency variable tone generator. The microprocessor controls the oscillator frequency of the PLL via the IIC bus. The phase-lock loop is susceptible to the bus traffic when the microprocessor sends commands to other IC's on the bus, so that instead of producing a tone locked at a specific frequency, a range of other frequencies around the desired tone frequency are produced.

For example, in a PLL having a 4 Mhz oscillator, any incidental noise signals generated by the microprocessor may be received by other pins of the PLL integrated circuit connected to the IIC bus. This noise will be added to the resultant signal frequency. In an instance where a user selects a channel at 701 Mhz and the receiver system requires a down-converted IF signal at 44 Mhz, then the PLL must generate a tone locked at a frequency of 745 Mhz. Normally, the 701 Mhz television signal and the 745 Mhz tone signal are mixed to produce an IF signal locked at 44 Mhz. However, additional noise will generate other harmonic frequencies around the tone frequency, causing the IF frequency fluctuate in a range around 44 Mhz instead.

Thus, the bus chatter is added to the incoming digital video/audio signal and causes a degradation in bit error rate (BER) performance of the television receiver. Ultimately, the bit errors manifest themselves as additional or missing luminance and chrominance pixel components in the video the user is viewing, as well as "clicks and pops" in the audio output. Similarly, when processing an analog television signal, the IIC bus chatter will manifest itself as a distorted picture and/or undesirable WOW and/or flutter in the audio output.

Phase noise interference, caused by the IIC bus traffic, may be compensated somewhat by widening the bandwidth of the demodulation IC's carrier tracking-loop, to allow it to "track out" the corruption. However, such a method allows additional low frequency noise to combine with the video/audio signal, thereby degrading the bit error rate of the television receiver.

Thus, there is a need to reduce the IIC bus chatter created by the IC traffic on the IIC bus. Furthermore, there is a need to reduce the IIC bus chatter before it influences the phase-lock loop circuitry of the tuner.

SUMMARY OF INVENTION

The disadvantages heretofore associated with the prior art, are overcome by the present invention of a method and apparatus for isolating a noise intolerant device, e.g., a phase-lock loop of a tuner within a television receiver, from source of noise. In one embodiment, the apparatus isolates a phase-lock loop integrated circuit (IC) from the bus, by providing an isolation buffer that allows the receiver to only pass data to the tuner's phase-lock loop IC when a tune command is issued by a processor.

When not being tuned, the IIC lines to the tuner are held HIGH by a buffer until needed again to perform the tuning function. This allows the demodulation circuitry to use a setting for a carrier tracking-loop that optimizes bit error rate performance.

BRIEF DESCRIPTION OF THE DRAWINGS

The teachings of the present invention can be readily understood by considering the following detailed description in conjunction with the accompanying drawings, in which:

FIG. 2 depicts a flow diagram of a method for isolating the tuner from the controller assembly in accordance with the present invention.

To facilitate understanding, identical reference numerals have been used, where possible, to designate identical elements that are common to the figures.

DETAILED DESCRIPTION OF THE INVENTION

Figure 1A:
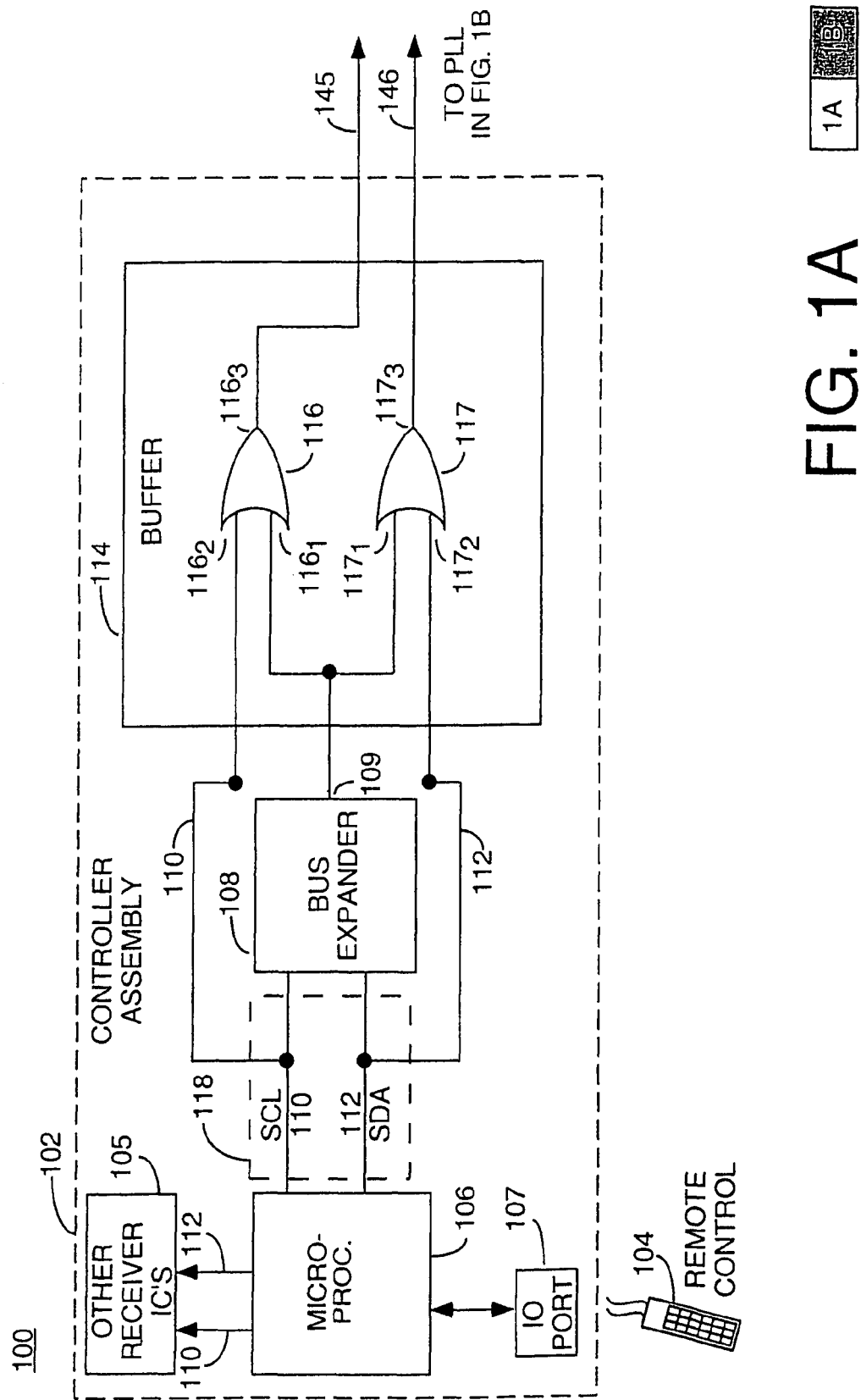
FIGS. 1A and 1B depict a block diagram of a portion of a television receiver comprising a buffer for an IIC bus.
Figure 1B:
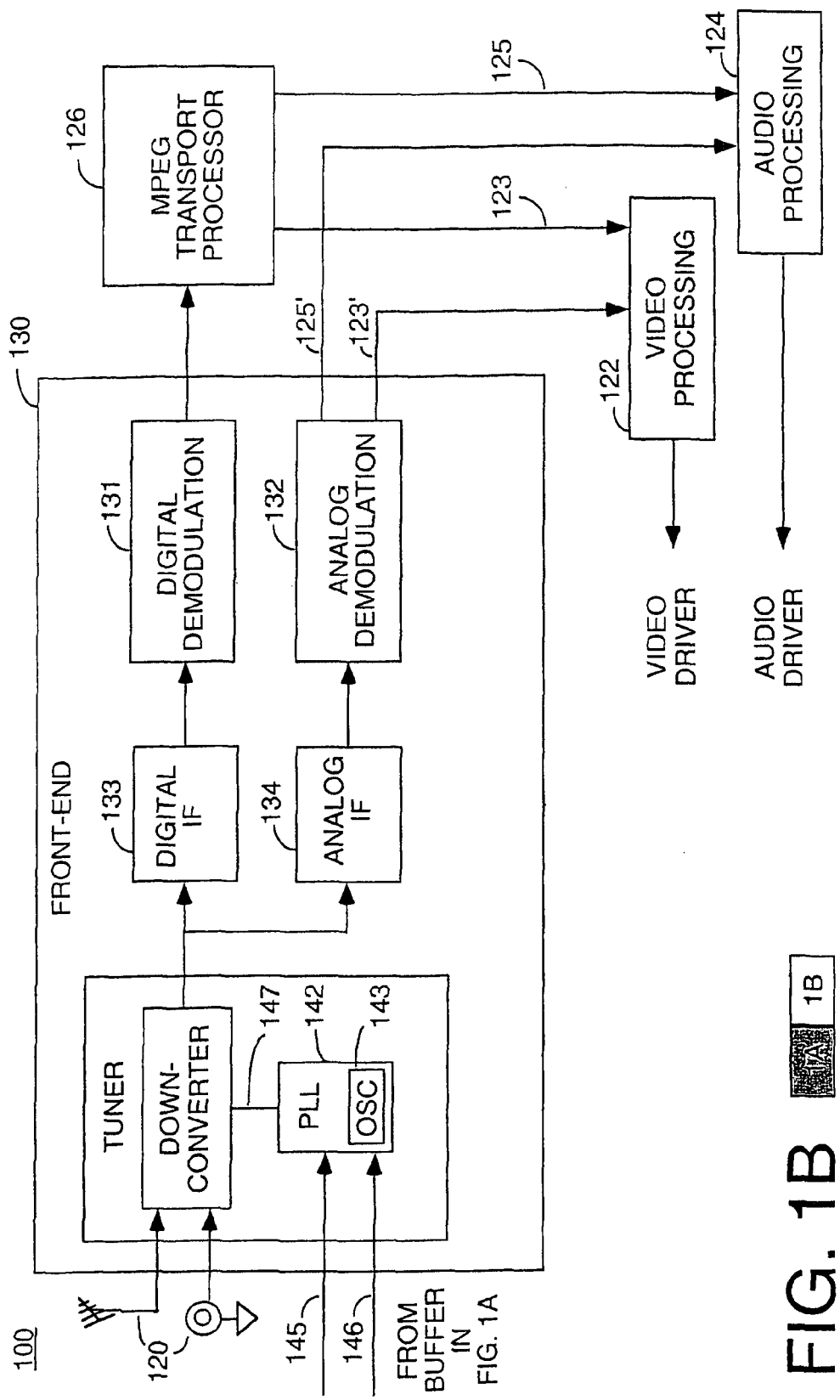

The invention will be primarily described within the context of a television receiver that receives audio and video television signals. However, it will be appreciated by those skilled in the art that the invention is well suited to any system in which digital signals are communicated on an I2C bus. Other signals and systems may illustratively include, but are not limited to, isochronous information transmitted to a television receiver, or digitized data that is transmitted between computers through cable modems on a cable system. FIGS. 1A and 1B together depict a block diagram of a portion of a television receiver (referred to hereinafter as receiver 100) comprising a buffer 114 for an IIC bus 118 in accordance with the present invention.

The receiver 100 comprises a controller assembly 102 (FIG. 1A), for selecting television signals 120 using an input device 104. The controller assembly 102 comprises a processor 106, a bus expander 108, and a buffer 114. A tuner 140 (FIG. 1B) comprises at least one phase-lock loop 142 and at least one down-converter 146, for tuning and down-converting the television signal 120. The tuner 140 is coupled from an output of the buffer 114 to an input of the phase-lock loop 142. The buffer 114 selectively controls data transmission to the tuner 140. The terminology processor and microprocessor are considered interchangeable, for purposes herein.

In this manner, the traffic noise from the microprocessor 106, which is generated when the microprocessor 106 is communicating with other receiver IC's 105 in the system, will be excluded from passing to the phase-lock loop 142. The elimination of noise from the phase-lock loop 142 permits the phase-lock loop 142 to lock at a specific frequency, and then generate a clear tone for mixing with the frequency down-converter 144. Thus, a substantially noise free IF television signal is produced.

Specifically, the receiver 100 comprises a front-end assembly 130 (FIG. 1B) having at least one tuner 140, at least one digital demodulator 131 and at least one analog demodulator 132, a digital IF down-converter 133 and an analog IF down-converter 134 to selectively tune, demodulate or otherwise "receive" at least one of a plurality of television signals 120, having audio and video information transmitted in either analog or digital formats. The analog formats include conventional analog broadcasting systems such as those conforming to the NTSC transmission standards. The digital formats include Digital Broadcast Satellite (DBS), Digital Video Broadcasting (DVB), as well as terrestrial broadcast such as high definition television (HDTV) and cable formats, each conforming, for example, to the ATSC and MPEG transmission standards.

A controller assembly 102 (FIG. 1A) is coupled to the front-end assembly 130 (FIG. 1B) through an input clock line 145 and an input data line 146 of the phase-lock loop 142. The controller assembly 102 allows a user to select and tune the front-end assembly 130 to any one of the television signals 120. The user makes a channel selection through an input device 104, such as a remote control, and the controller assembly 102 sends a channel selection signal through the IIC bus 118 to the front-end assembly 130.

The front-end assembly 130, in response to the channel selection signal provided by the controller 102, operates to tune a selected television signal 120 for reception. In the instance where the selected television signal is a digital television signal, such as a HDTV channel, the digital demodulator 131 of the front-end assembly 130 demodulates the bit stream. The demodulated digital IF signal is then sent for processing at the MPEG transport processor 126. The MPEG transport processor 126 separates the video and audio signal information and sends such video and audio information to a video processor 122 (via signal path 123) and an audio processor 124 (via signal path 125), respectively.

In the instance where an analog television signal is selected, an analog demodulator 132 of the front end assembly 130 demodulates the video and audio information within the selected television signal, and provides the video and audio information to the video processor 122 and the audio processor 124, respectively. Thus, in an analog signal circumstance, it is not necessary to send the demodulated audio/video IF signal to the MPEG transport processor 126. Finally, after either the digital or the analog baseband signal has been recovered, the video processor 122 and the audio processor 124 process the video and audio information, and then send the video and audio information to their output devices, such as a display panel and speaker.

In particular, the controller assembly 102 comprises a microprocessor 106 coupled to a bus expander 108, via the IIC bus 118 serial clock and data signal paths 110 and 112, and a plurality of other receiver IC's 105 also coupled to the IIC bus for other data processing purposes. The microprocessor 106 functions as a master IC on the IIC bus, and controls the IIC bus 118 at all times. As such, all of the remaining IC's coupled to the IIC bus 118 operate in a slave mode of operation.

The bus expander IC 106 is coupled to the IIC bus 118 to enable non-IIC compliant IC's to interface with the IIC compliant IC's on the IIC bus 118. The bus expander IC 106 is further coupled to a buffer 114. The buffer 114 comprises a pair of OR gates 116 and 117. However, a person skilled in the art for which the invention pertains will recognize that other buffering devices, such as discrete transistor circuits, may also be utilized.

An output control port 109 of the bus expander 108 is coupled to both the first and second OR gates 116 and 117, through first input ports $116_1$ and $117_1$ on each OR gate 116 and 117. Additionally, a serial clock line 110 is coupled to a second input port $116_2$ on the first OR gate 116. Similarly, a serial data line 112 is coupled to a second input port $117_2$ on the second OR gate 117. The pair of OR gates 116 and 117 are then coupled to a tuner 140 in the front-end receiver 130, through their respective output ports $116_3$ and $117_3$. The output port of the first OR gate $116_3$ is coupled to the input clock line 145 of the phase-lock loop 142. Furthermore, the output port of the second OR gate $117_3$ is coupled to the input data line 146 of the phase-lock loop 142.

In operation, the microprocessor 106 sends a command signal to the bus expander 108 to set the bus expander's output control port 109 to a logically HIGH state. The bus expander's 108 internal circuitry (not shown) sets the control port 109 HIGH, thereby setting the first input ports $116_1$ and $117_1$ of the pair of OR gates 116 and 117 to a HIGH state. Therefore, the Boolean logic for an OR gate dictates that no matter what the input signal may be at the second input ports $116_2$ and $117_2$ of the first and second OR gates 116 and 117, the respective outputs $116_3$ and $117_3$ of the OR gates 116 and 117 will always be at a logical HIGH state, i.e., bus traffic noise will be precluded for being coupled to the tuner 140.

The tuner 140 of the receiver 100 comprises a phase-lock loop IC (PLL) 142 having an oscillator (e.g., voltage controlled oscillator (VCO)) 143 coupled to a down converter 144 through a signal path 147. In an instance where a user selects an analog channel, the tuner 140 produces the video and audio IF signals sent to the video and audio processors 122 and 124 for processing of the video and audio information. In an instance where a user selects a digital channel, the tuner 140 produces a digital IF signal (e.g., 5.38 Mhz) that gets forwarded to the digital demodulator 132 to separate out the carrier component of the signal and provide the baseband signal. The baseband signal is then forwarded to the MPEG transport processor 126 where the video and audio substreams are separated for processing at the video and audio processors 122 and 124.

The output of the first OR gate $116_3$ is coupled to the input clock line 145 of the phase-lock loop IC 142 in the tuner 140. Furthermore, the output of the second OR gate $117_3$ is coupled to the input data line 146 of the phase-lock loop IC 142. Thus, the buffer 114 functions to selectively isolate both phase-lock loop inputs 145 and 146 of the phase-lock loop IC 142 from the IIC bus 118 and the microprocessor 106.

In operation, when the bus expander 108 is sent a command signal from the microprocessor 106 to hold the output control port 109 "HIGH", each OR gate 116 and 117 will logically hold their respective outputs $116_3$ and $117_3$ HIGH. Thus, the input clock line 145 and the input data line 146 of the phase-lock loop IC 142 are logically in a HIGH state. In an instance where both the serial clock and serial data lines on an IIC bus are held in a HIGH state, no data may be transferred between the two devices. Therefore, in this instance, the traffic noise from the microprocessor 106 that exists when the microprocessor 106 is communicating with other receiver IC's 105 in the system, will be excluded from passing through the input clock and data lines 145 and 146 of the phase-lock loop IC 142, and will not affect the generation of tones by the VCO 143.

FIG. 2 depicts a flow diagram of a method for isolating the tuner from the bus in accordance with the present invention. The method begins at step 200 and proceeds to step 202, where a user selects a television signal from a control device. At step 204, the television signal is coupled to a down-converter or mixer for further processing.

In step 206, the microprocessor (master) signals the bus expander, via a first IIC command, to set the bus expander output to a LOW state. Henceforth, the phase-lock loop may receive data transmission from the microprocessor, via the SCL and SDA lines. To start data transmission, the microprocessor sets the SDA line of the IIC bus from a steady state HIGH, to a LOW transition, while the SCL is held in a steady state HIGH. Such transition indicates a start condition for the exchange of data bits. The HIGH or LOW state of the data line (SDA) may only change when the clock signal on the SCL line is LOW. At the next clock pulse from the microprocessor, the serial clock line is set LOW, causing the output clock line of the buffer (i.e., first OR gate of FIG. 1) coupled to the clock input of the phase-lock loop, to a LOW state.

At each subsequent LOW clock pulse, data may be transmitted over the SDA line, thereby permitting the phase-lock loop IC to receive data transmissions over the IIC bus from the microprocessor. The data transmissions contain information necessary for the phase-lock loop to generate a tone, which facilitates demodulation of a television signal located at a particular channel. As long as the microprocessor sends a repeated START signal, prior to transmitting each byte, the IIC bus remains in a "busy" state. When the microprocessor has completed the data transmission, the microprocessor generates a LOW to HIGH transition on the SDA line, while the SCL is HIGH, to define a stop condition.

In step 208, once the phase-lock loop receives the information necessary to generate the tone, the phase-lock loop locks at a specific frequency designated by the microprocessor. The method proceeds to step 210, where the microprocessor, via a second IIC command from the microprocessor, causes the output on the bus expander to go into a HIGH state. The HIGH state from the output of the bus expander, thereby causes the buffer to also go into a HIGH state, in a similar manner as described above. At this point, the phase-lock loop is appropriately locked at a specific frequency, and the phase-lock loop is isolated from any further communications (noise) from the microprocessor's activities with other IC's on the IIC bus.

In step 212, the television signal and the locked frequency tone are combined in the down-converter, and an IF signal is produced. Thus, when the tone is mixed with the television signal in the down-converter, a IF signal is produced without any fluctuations in frequency due to microprocessor generated bus noise. In step 214, the IF signal is demodulated (then sent to an MPEG processor to produce video and audio substreams in the instance where the signal is a digital IF signal), and processed to produce the desired audio and video output. At step 216, the method ends, until a user requests a different television channel whereupon the inventive method is repeated.

It should be apparent to those skilled in the art that a novel method and apparatus for excluding noise from an input of a terrestrial television signal tuner has been provided. The buffer device inventively functions to isolate the phase-lock loop IC from noise occurring on the IIC bus. Although various embodiments that incorporate the teachings of the present invention have been shown and described in detail herein, those skilled in the art can readily devise many other varied embodiments that still incorporate these teachings.

What is claimed is:

1. A method for isolating a phase-lock loop in a tuner of a television receiver, comprising the steps of:
    sending a first command from a processor to a phase-lock loop via a digital bus to generate a frequency tone; and
    sending a second command to a buffer to isolate said phase-lock loop from said processor, such that said phase-lock loop is operatively coupled to said processor via said digital bus only when said processor is communicating with said phase-lock loop.

2. The method of claim 1, wherein said first command sending step further comprises the steps of:
    setting an inter-integrated circuit bus expander output to a LOW logical state, after receiving a request for a selected television signal from a user, in response to said first command by said processor; and
    coupling said phase-lock loop to an inter-integrated circuit bus, for enabling said processor to communicate with said phase-lock loop to generate said frequency tone.

3. The method of claim 2 wherein said coupling step further comprises the step of:
    enabling, in response to said bus expander output, said buffer to couple said phase-lock loop to said inter-integrated circuit bus.

4. The method of claim 2, wherein said second command sending step further comprises the step of:
    setting an output of said buffer to a HIGH logical state after said phase-lock loop locks to said frequency tone, in response to said second command from said processor.

5. The method of claim 1, wherein said phase-lock loop is isolated from said processor before said step of sending said first command and said method further comprises a step of sending a third command to said buffer to operatively couple said processor to said phase-lock loop before the step of sending said first command.

6. The method of claim 1, wherein said digital bus is an inter-integrated circuit bus having a serial clock line and a serial data line.

7. The method of claim 6, further comprising a step of sending a first signal via said inter-integrated circuit bus to terminate communication with said phase-lock loop after the step of sending said first command and before said step of sending the second command.

8. The method of claim 7, further comprising a step of sending a second signal via said inter-integrated circuit bus to start communication with said phase-lock loop before the step of sending said first command.

9. The method of claim 6, wherein said phase-lock loop is isolated from said processor before said step of sending said first command and said method further comprises a step of sending a third command to said buffer to operatively couple said processor to said phase-lock loop before the step of sending said first command.

10. The method of claim 6, further comprising a step of setting serial clock and data lines connected to said phase-lock loop to a high state in response to said second command.

11. The method of claim 1, wherein said second command is sent to said buffer via said digital bus.

12. A method for isolating a phase-lock loop in a tuner of a television receiver, comprising the steps of:
  receiving a signal by a processor to communicate with said phase-lock loop;
  sending a first command by said processor to a buffer to couple said phase-lock loop to said processor via an inter-integrated circuit bus responsive to said receiving step;
  sending a second command from said processor to said phase-lock loop via said inter-integrated circuit bus to generate a frequency tone responsive to said step of sending said first command; and
  sending a third command to said buffer to isolate said phase-lock loop from said processor responsive to said step of sending said second command.

13. The method of claim 12, wherein said third command is sent to said buffer via said inter-integrated circuit bus.

* * * * *